(12) United States Patent
Bell et al.

(10) Patent No.: US 6,478,667 B2
(45) Date of Patent: Nov. 12, 2002

(54) METHOD AND APPARATUS FOR TENDERIZING MEAT

(75) Inventors: Brian W. Bell, Wichita, KS (US); Howard G. Dolezal, Derby, KS (US); Darren J. Grose, Wichita, KS (US)

(73) Assignee: Excel Corporation, Wichita, KS (US)

( * ) Notice: Subject to any disclaimer, the term of this patent is extended or adjusted under 35 U.S.C. 154(b) by 25 days.

(21) Appl. No.: 09/771,760

(22) Filed: Jan. 29, 2001

(65) Prior Publication Data

US 2001/0034201 A1 Oct. 25, 2001

Related U.S. Application Data

(60) Provisional application No. 60/178,836, filed on Jan. 28, 2000.

(51) Int. Cl.$^7$ .................................................. A22C 9/00
(52) U.S. Cl. ...................................................... 452/141
(58) Field of Search ............................... 452/122, 141, 452/148

(56) References Cited

U.S. PATENT DOCUMENTS

| | | | |
|---|---|---|---|
| 1,614,312 A | 11/1927 | Miller | |
| 2,026,242 A | 12/1935 | Miller | 17/44 |
| 3,483,592 A | 12/1969 | Aubert | 17/46 |
| 3,579,716 A | 5/1971 | Stouffer et al. | 17/45 |
| 3,593,369 A | 7/1971 | Anderson et al. | 17/46 |
| 3,641,625 A | * 2/1972 | Allinquant | 452/141 |
| 3,774,264 A | 11/1973 | Anderson et al. | 17/1 R |
| 3,774,265 A | 11/1973 | Anderson et al. | 17/24 |
| 3,863,294 A | 2/1975 | Barbee | 17/21 |
| 3,940,830 A | 3/1976 | Anderson et al. | 17/24 |
| 4,139,926 A | 2/1979 | Hughes et al. | 17/52 |
| 4,337,550 A | 7/1982 | Baylor et al. | 17/23 |
| 4,358,872 A | * 11/1982 | VanZandt | 452/141 |
| 4,525,896 A | * 7/1985 | Leining et al. | 452/148 |
| 4,667,368 A | 5/1987 | Menqi | 17/23 |
| 4,706,335 A | 11/1987 | Schram et al. | 17/23 |
| 5,045,021 A | * 9/1991 | Borup | 452/74 |
| 5,152,713 A | 10/1992 | Baertlein | 452/64 |
| 5,507,688 A | 4/1996 | Van Ochten | 452/64 |
| 5,632,670 A | * 5/1997 | Gwyther | 452/74 |
| 5,855,507 A | 1/1999 | Fisher et al. | 452/149 |
| 5,899,802 A | * 5/1999 | Burnett | 452/141 |
| 5,968,565 A | 10/1999 | Owens et al. | 426/2 |
| 6,019,033 A | * 2/2000 | Wilson et al. | 452/74 |
| 6,050,889 A1 | 4/2001 | Jacobs et al. | 452/160 |
| 6,290,592 B1 | * 9/2001 | Allen et al. | 452/141 |

OTHER PUBLICATIONS

Proceedings 46th Annual Reciprocal Meat Conference, *American Meat Science Association,* Published by National Live Stock and Meat Board, (1994).

Got, F. et al. "Effects oh high–intensity high–frequency ultrasound on ageing rate, ultrastructure and some physico–chemcial properties of beef", *Meat Science* 51 pp. 35–42 (1999).

Lan, Y.H. et al., "Thermal Gelation of Stretched and Cold–Shortened Bovine Sternomandibularis Muscle and Myofibibrils", *Journal of Food Science,* vol. 60, No. 4, pp. 661–663 (1985).

Swatland, H. J., "Effect of stretching pre–rigor muscle on the backscatteriong of polarized near–infrared", *Food Research International,* vol. 29, No. 5–6, pp. 445–449, (1996).

Lyon, C.E., et al. "Research Note: Effects of Wing Restraints on the Objective Texture of Commercially Processed Broiler Breast Meat", *Poultry Science* 71 pp. 1228–1231 (1992).

(List continued on next page.)

*Primary Examiner*—Peter M. Poon
*Assistant Examiner*—Joan Olszewski
(74) *Attorney, Agent, or Firm*—Dorsey & Whitney LLP

(57) ABSTRACT

A method for tenderizing meat. The method includes separating one or more vertebrae of a carcass of a red meat slaughter animal prior to rigor mortis, wherein the act of separating enables stretching of muscle fibers in the carcass.

21 Claims, 12 Drawing Sheets

OTHER PUBLICATIONS

Mitchell, et al., "Tenderizing, Aging, and Thawing Effects on Sensory, Chemical, and Physical Properties of Best Steaks", *Journal of Food Science*—1125, vol. 58, No. 5, (1991).

Winstanley, Monica, B. Sc., Ph.D. of the Meat Research Institute "The aging of meat", *Nutrition and Food Science* pp. 8–10, (Sep./Oct. 1979).

Norman, G.A, et al. "The influence of carcase position during rigor on the tenderness of bovine muscles from mature zebu animals", *Trop. Sci.* pp. 287–296, (1980).

Wang, H., et al., "Tenderness of Prerigor Stretched Porcine Longissimus Muscle" *Journal of Muscle Foods*, vol. 6, No. 1, Marriott et al.,. Food & Nutrition Press, Inc., pp. 75–82 (1995).

Wang, H. et al. "Selected Skeletal Alterations To Improve Tenderness Of Beef Round Muscles" *Journal of Muscle Foods*, vol. 5, No. 2, Marriott et al., Food & Nutrition Press, Inc., pp. 137–147 (1994).

Wang, H. et al., "Prerigor Treatment and Endpoint Temperature Effects On U.S. Choice Beef Tenderness", *Journal of Muscle Foods*, vol. 7, No. 1, pp. 45–54 (1996).

Marriott, N. G., et al. "Meat Tenderness Revisited", *Overviews, Meat Focus International* pp. 373–376 Sep. (1994).

Claus et al., "Prerigor Carcass Muscle Stretching Effects on Tenderness of Grain–fed Beef Under Commerical Conditions", *Journal of Food Science*, vol. 62, No. 6, pp. 1231–1234, (Nov.–Dec. 1997).

Ludwig et al., "Skeletal Alteration to Improve Beef Longissimus Muscle Tenderness", *Journal of Animal Science*, vol. 75, No. 9, pp. 2404–2410 (Sep. 1997).

Quarrier et al, "A Physical Method to Increase Tenderness in Lamb Carcasses", *Journal of Food Science*, vol. 37 No. 1, 3 pgs. (Jan.–Feb. 1972).

Claus, J.R., et al., "Prerigor Skeletal Cuts To Improve Beef Tenderness Under Commercial Conditions", *American Meat Science Association*, pp. 606–607.

Herring, H.K, et al., "Further Studies on Bovine Muscle Tenderness as Infuenced by Carcass Position, Sarcomere Length, and Fiber Diameter" *Journal of Food Science*, vol. 30, No. 6, pp. 1049–1054 (Nov.–Dec.), 1965.

Beaty, S.L., et al., "Early Postmortem Skeletal Alterations Effect on Sarcomere Lenght, Myofibbillar Fragmentation, and Muscle Tenderness of Beef from Light–Weight, Brangus Heifers" *Journal of Muscle Foods*, pp. 67–78 (Feb. 3, 1998).

Claus, J.R., "The Tendercut™ Process", *The American Meat Institute Foundation, The American Meat Science Association*, Proceedings of the 1994 Meat Industry Research Conference, pp. 101–113 (Sep. 29–Oct. 1, 1994).

Claus et al., "The Tendercut Process".

Cotroneo, C.J., "Selected Skeletal Alteration to Improve Beef Tenderness", *Thesis submitted to the faculty of the Virginia Polytechnic and State University*, 121 pgs. (Jul. 16, 1992).

\* cited by examiner

METHOD AND APPARATUS FOR TENDERIZING MEAT

CROSS-REFERENCE TO RELATED APPLICATION(S)

This application claims priority from provisional application Ser. No. 60/178,836, filed Jan. 28, 2000, entitled "Method and Apparatus for Tenderizing Meat," by Howard G. Dolezal Jr. et al.

BACKGROUND OF THE INVENTION

This invention relates generally to food processing, particularly meat processing and improving the tenderness of meat. More particularly, the invention relates to methods and apparatuses for improving meat tenderness through manipulation of an animal carcass or portions thereof prior to rigor mortis, including separation of one or more vertebrae of a carcass.

Consumers of meat products generally prefer tender meat. Inadequate tenderness is therefore an important quality control concern for meat producers, particularly red meat producers. In addition, a large amount of variation may exist in the tenderness of meat cuts at retail and food service levels. Improvements in the tenderness of meat products would allow a meat producer to increase both the quantity of meat products sold and the price at which those products are sold.

A number of factors influence the tenderness of meat, including genetics, the age of the animal at slaughter, the breed of the animal, the animal's health, whether the animal is range fed or fed cereal grains, the amount of growth hormones administered to the animal, and the climate. Genetics may account for around thirty percent of the influence on meat tenderness, with other factors accounting for the remaining seventy percent. Older animals typically produce tougher, less tender meat than do younger animals. If an animal is in poor health, the meat resulting from that animal may be less tender. If an animal receives a large amount of growth hormones during the animal's life, the meat resulting from that animal may be less tender. Certain types of cattle, such as Brahman, generally produce less tender meat than do other cattle. Cattle with larger hump heights generally are more likely to be Brahman cattle or have a hereditary link to Brahman cattle, and therefore typically produce less tender meat.

A variety of methods have been used in an attempt to improve the tenderness of red meat products, including electrical stimulation of pre-rigor carcasses, chemical injections, maceration, and various feeding techniques. Methods involving chemical injections have been devised that may be conducted on animals prior to slaughter and also on carcasses after slaughter. Some of these techniques involve injections of brine solutions, such as calcium chloride, in an effort to increase tenderness. Other methods involve the injection of enzymes or chemicals into an animal or a carcass to improve meat tenderness. Dietary supplements include the administration of Vitamin D or its analogs or derivatives to livestock, as is described in U.S. Pat. No. 5,968,565 to Owens et al. Maceration techniques commonly involve penetration of the meat with needles or the like to increase tenderness.

The methods for tenderizing meat discussed above have a number of disadvantages. These methods are generally expensive and labor intensive, and hence are not viable for commercial production of meat products. Expenses include labor costs for injections, feed supplements, maceration techniques, as well as equipment and chemical, enzyme, or feed supplement costs. In addition, the consuming public may be concerned with the safety of the use of chemicals, enzymes, or feed supplements. Further, the effectiveness of the above methods may be questioned and the administration of these techniques may be complex to control.

Postmortem aging of meat is another common technique for tenderizing meat. Meat may be aged for a variable period of time (in the area of from three to ninety-nine days) to increase meat tenderness, depending on the type of animal and the cut of meat. Aging increases tenderness because enzymatic degradation of muscle fibers occurs. Aging of meat, however, has disadvantages. First, the longer meat is aged, the larger the amount of moisture that is lost from the meat, thus influencing the palatability of the meat. Second, there is a storage cost for aging meat in commercial meat production. Third, aging of meat influences the shelf life of the meat product. If meat is aged for a large amount of time, for instance, the shelf life of the product will decrease, and the meat may also not look as appetizing (the color may be altered) as meat that has not been aged as long.

In addition to those methods discussed above for improving the tenderness of meat, another method described by Claus and Marriot, referred to as the "Tendercut Process" has been proposed to increase the tenderness of beef. In the Tendercut Process, a beef carcass is manipulated after slaughter and prior to rigor mortis. After the beef carcass has been split in half (by sawing the carcass midway through the spinal column to form a left side and a right side), the Tendercut Process involves making one or two detailed cuts. One cut is made between the fourth and fifth sacral vertebrae of the carcass, and involves a complete cut of the sacral vertebrae and all fat, connective tissue, and minor muscles surrounding the wholesale round muscles of the beef carcass. A second cut is made between the twelfth and thirteenth ribs of the carcass, and involves a complete cut of the vertebral column and the spinal processes, as well as all fat, connective tissue, intercostal muscles, and minor muscles surrounding the longissimus dorsi. After the carcass is cut, a separation between bones and tissues in the location of the cut of between 4–6 inches results, thus stretching the muscle prior to rigor mortis to reduce shortening of the muscle fiber during chilling of the carcass.

The Tendercut Process, has a number of disadvantages for the commercial production of meat products. A large number of procedures are required in this process, including sawing the vertebrae with a saw and cutting the minor muscles, fat, and connective tissue with a knife. This method is very time consuming due to the number of knife cuts required, thus requiring a large expenditure for labor if used in a commercial meat production facility. In addition, due to the number and complexity of the saws and cuts that are required, a significant chance of damage to the primary muscles results (those muscles for which stretching is desired to increase tenderness, e.g., the longissimus dorsi and round muscles of beef carcasses). Moreover, this method may alter the appearance of the muscles and fat assigned by the USDA graders (quality and grade) because the location of the cut between the twelfth and thirteenth ribs is the area evaluated for USDA grades. The Tendercut Process has not been adopted widely in commercial processes.

U.S. Pat. No. 3,579,716 to Stouffer et al. ("Stoufffer '715") issued on May 25, 1971, discloses another meat tenderizing method. The Stouffer patent discloses tenderizing a muscle in the following manner: "The backbone—which is visible on the split carcass half—is severed (preferably at several spaced locations), whereby the weight of the carcass half is sufficient to extend and maintain tension on the longissimus muscle during the passage of rigor mortis."Stouffer '716, col. 4, ll. 21–25. Stouffer '716 also discloses that additional weights may be added to the carcass for further tensioning. When the application for Stouffer '716 was filed in 1969, commercial meat production facilities were vastly different than today. Typically, chains were not used to transport animal carcasses in 1969 and slaughter and production rates were significantly slower than today. Stouffer '716, therefore, does not disclose a tenderizing method that may be readily used in commercial meat production facilities today. In addition, animals, for example, cattle for beef production, were not administered growth hormones in 1969 as is common today. The beef resulting from the carcasses in 1969, therefore, differed in many properties, including tenderness, from beef today, and hence treatment of carcasses today differs from treatment of carcasses in 1969.

A need exists for methods and apparatuses for improving the tenderness of meat that are inexpensive and commercially practical, easy and quick to conduct, not significantly invasive, and that will not raise concerns with the consuming public about additives to meat products.

BRIEF SUMMARY OF THE INVENTION

One embodiment of the invention is a method for tenderizing meat. In this embodiment, the invention includes manipulating, particularly separating one or more vertebrae of a carcass of a red meat slaughter animal prior to rigor mortis, wherein the act of separating is conducted at a commercial chain speed. In another embodiment of the invention, the separation of the one or more vertebrae may be conducted without separating the connective tissue, fat, and minor muscles on the portion of the carcass opposite the vertebrae or, in another embodiment, only the connective tissue and fat adjacent the vertebrae are separated during separation of the one or more vertebrae and the separation of this connective tissue and fat is incidental to the vertebrae separation. The separation of the vertebrae results in increased meat tenderness.

Another embodiment of the invention is a carcass of a red meat slaughter animal, wherein one or more vertebrae of the carcass have been separated prior to rigor mortis, and wherein the one or more vertebrae have been separated at a commercial chain speed.

The present invention also encompasses an apparatus for separating one or more vertebrae of a carcass. In one embodiment, the apparatus comprises a carcass contacting plate, an operating member operably coupled to the plate, and a drive mechanism operably coupled to the operating member for driving the operating member into a carcass to manipulate a vertebra or vertebrae. In one embodiment, the apparatus includes a plate or plate system comprising two plate members for contacting or mounting to the carcass, a wedge-shaped piercing member movably connected to the plate system, and a drive mechanism system operably coupled to the piercing member for driving it through one or more vertebrae of the carcass to achieve separation of the one or more vertebrae during use of the apparatus. This embodiment of the invention provides for repeatable separations of the one or more vertebrae of a carcass without risking damage to the major muscles of the carcass. In addition, this apparatus allows for fast separation of the vertebrae for use during commercial meat production processes.

Still other embodiments of the present invention will become apparent to those skilled in the art from the following detailed description, wherein is shown and described only the embodiments of the invention by way of illustration of the best modes contemplated for carrying out the invention. As will be realized, the invention is capable of modification in various obvious aspects, all without departing from the spirit and scope of the present invention. Accordingly, the drawings and detailed description are to be regarded as illustrative in nature and not restrictive.

DETAILED DESCRIPTION

Figure 1:
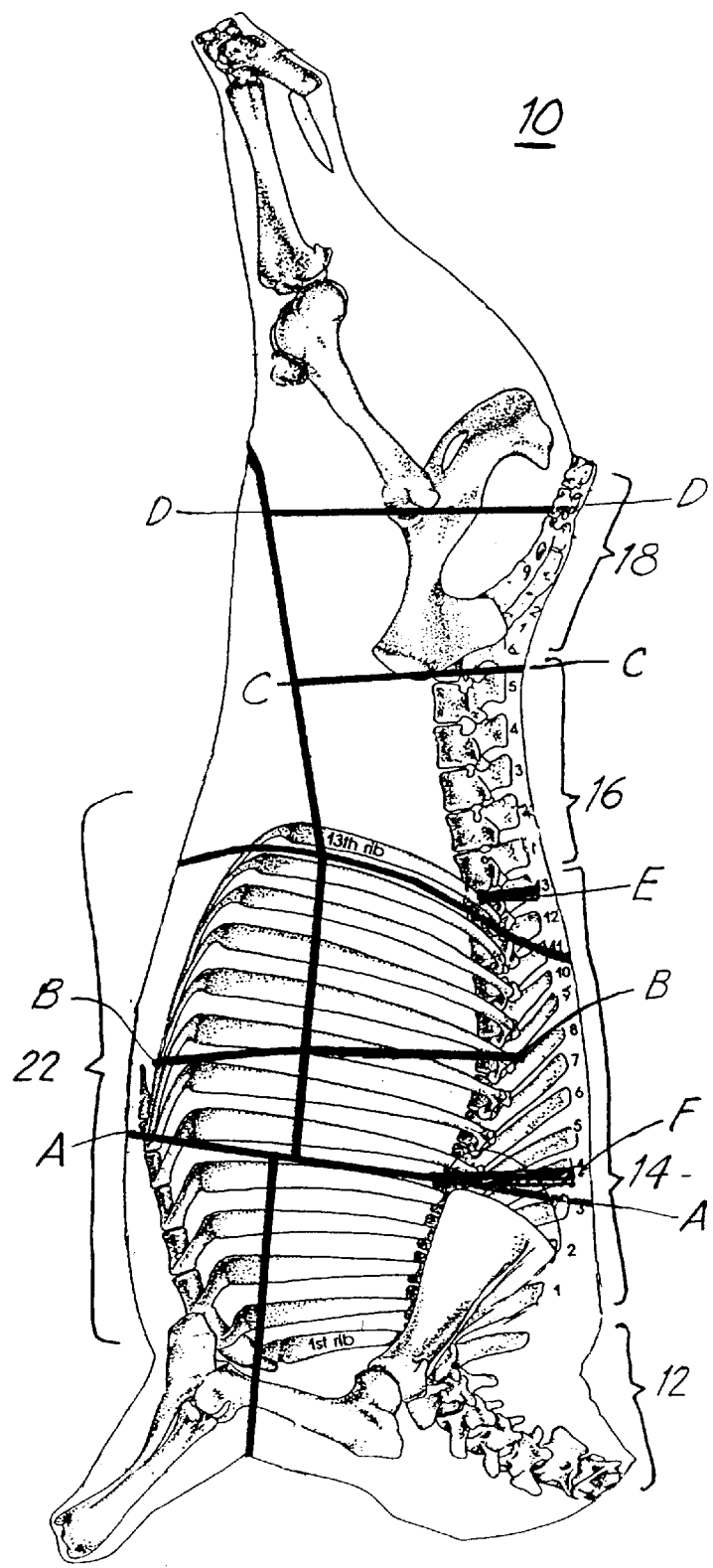
FIG. 1 is a side view of a beef carcass illustrating the bone structure of the carcass.

Throughout this specification, the term "red meat slaughter animal" is used to refer to an animal that is slaughtered for red meat consumption, including but not limited to all age classes of bovine, porcine, and ovine animals. In this specification, bovine animals include, but are not limited to, cattle, steers, heifers, cows, bulls, and also buffalo. Porcine animals include, but are not limited to, sows, gilts, barrows, boars, and feeder pigs. Ovine animals include, but are not limited to, sheep and lamb. The present invention applies to the production of tenderized red meat products from such red meat slaughter animals and possibly to the production of tenderized meat from other animals as well, such as poultry. Although portions of this detailed description depict and describe embodiments of the invention dealing with beef or beef carcasses, these references to beef should not be read to limit the invention to the production of beef products. Rather, this specification should be read as applying to any animal, including a red meat slaughter animal.

A. General Overview

One embodiment of the present invention is a method for tenderizing meat in which one or more vertebrae of the carcass are separated prior to rigor mortis. Such a separation may be performed during commercial beef production, which involves a number of standard steps, and the separation may be performed at a commercial chain speed. The cattle are first stunned and then bled. Next, the hide is stripped from the beef carcass and the head, extremities, and viscera are removed. The beef carcass is then sawed in half, thus producing two sides of beef, with each side containing half of the vertebral column and sternum, and each side being generally symmetric with the other side. Throughout this specification, the term "carcass" will be used to refer to the corpse of a slaughtered animal, and may include a whole corpse of the animal or a side of the animal that results from splitting a whole carcass into two sides.

After a beef carcass is split into two sides, each side (or carcass) is washed and then optionally pasteurized, commonly using a steam pasteurization system. In some beef production processes, the carcasses are subjected to electrical stimulation in an effort to tenderize the meat of the carcass. In some electrical stimulation processes, electrical stimulation is applied to the carcass at fifty volts for approximately thirty to sixty seconds. The applicants hereby incorporate by reference, in its entirety, U.S. patent application Ser. No. 09/562,614, filed May 1, 2000 entitled "Method for Processing an Animal Carcass and Apparatus for Providing Electrical Stimulation," issued as U.S. Pat. No. 6,290,592, which discusses and details an electrical stimulation procedure and apparatus.

One embodiment of the invention is a method for tenderizing meat. In this embodiment, a vertebra of the carcass is separated prior to rigor mortis. In another embodiment, two vertebrae are separated prior to rigor mortis. In any embodiment, separation is accomplished by breaking, snapping, sawing, piercing, severing, parting, detaching, shearing, or removing a single vertebra or portions thereof, or it is accomplished by breaking, snapping, sawing, piercing, severing, parting, detaching, shearing, or removing two vertebrae or portions thereof.

Although the reason vertebra or vertebrae separation increases meat tenderness is not definitively known, the applicants believe that the separation of the vertebra or vertebrae causes the weight of the portion of the carcass below the separation to pull on the muscle fibers adjacent to the separation, thus causing a stretching of muscle fibers in the carcass and increased meat tenderness as a result. This separation of the vertebra or vertebrae and stretching of the muscle fiber is, in one embodiment, done soon after the animal is slaughtered and prior to rigor mortis so that the muscle fiber may be stretched. The vertebra or vertebrae of the carcass (shown in FIG. 1) may be separated in any location, including in the sacral vertebrae, lumbar vertebrae, or thoracic vertebrae. It should be noted, however, that the location of the separation may determine the muscle that is stretched and hence tenderized by the vertebra or vertebrae separation. Throughout this specification, the term "vertebrae" will be used to refer to two or more of the sacral vertebrae, lumbar vertebrae, or thoracic vertebrae. The term "vertebra" will be used to refer to a single sacral vertebra, lumbar vertebra, or thoracic vertebra.

1. Separating the Vertebra or Vertebrae

Any method known to those skilled in the art may be used to separate the vertebra or vertebrae of the carcass, including sawing, chopping, cutting, or possibly crushing, and any tool used in the art may therefore be used to perform the separation. To perform the separation, sawing may be performed using any type of saw known to those skilled in the art, including a circular saw, splitting saw, or a hack saw, as commonly used in the meat industry. Cutting or snipping to perform the separation may be done using a clipper or scissors or any other device known to those skilled in the art. Chopping to perform the separation may be done using an ax or chopping device of any sort known to those skilled in the art.

Another method to separate the vertebra or vertebrae is through piercing or driving a wedge through the vertebra to break the vertebra into one or more portions, for example an upper portion and a lower portion. A wedge could also be used to pierce or drive between two vertebrae to separate the vertebrae. Separated portions of a vertebra or separated vertebrae may be removed. "Separation" is intended to encompass removal of a vertebra, pieces of vertebra, vertebrae or pieces or sections of vertebrae. Section C of this specification and FIGS. 6–16 detail two embodiments of an apparatus for separating the vertebra or vertebrae of a carcass, which may include driving a linear or rotational wedge into a vertebra or between vertebrae to achieve splitting, separation, or spacing, and also to provide an initial stretch of the muscle fiber.

In one embodiment, one simple cut, saw, pierce, or slice may be used to separate the vertebra or vertebrae of the carcass. In this embodiment, the minor muscles, fat, and connective tissues surrounding the major muscles in the area of the vertebra or vertebrae separation do not need to be separated. In another embodiment, only a minimal amount of the minor muscles, connective tissues, and fat are separated. In these embodiments, the only separation or the primary separation is the splitting or dividing of a vertebra and the separation or spacing of the pieces of the vertebra, or the splitting or dividing of vertebrae or the separation or further spacing of the vertebrae.

In one embodiment of the present invention, a circular saw is used to separate the vertebrae. The first cut is generally horizontal and cut to a depth (limited by the use of a guide, for example) to completely sever the vertebra with minimal invasion into the surrounding musculature. In one embodiment, the cut is made from the split side face of the carcass by moving the saw from the stomach side toward the back side of the carcass. In another embodiment, a second cut is then made at an angle generally parallel to the angle of the feather bones. This second cut is made generally in the area between the feather bones to effect further structural separation. In another embodiment, a separate blade or knife is used to separate the area between the feather bones. In one embodiment of the present invention, the saw does not separate the chine of the lumbar, and the chine is separated by snipping.

These embodiments of the invention, therefore, may be carried out during commercial meat production processes without disrupting the chain speed at which carcasses move. In commercial beef production, for instance, carcasses typically move along a single chain or line at the rate of 150–600 head of cattle per hour, more particularly 200–400 head of cattle per hour, and even more particularly 250–350 head of cattle per hour, although this rate may vary widely.

To make separation of the vertebra or vertebrae a viable commercial process for increasing the tenderness of meat, it is helpful for the vertebra or vertebrae separation to be a quick operation so that the separation may be performed on carcasses at speeds that equal the chain speed of the processing line, or at commercial chain speeds. Throughout this specification, the phrase "commercial chain speed" will be used to refer to the chain speed, such as those detailed above for beef production, at which carcasses typically move along a meat processing line in modern production facilities. If detailed cutting of minor muscles, tissue, and fat surrounding major muscles is used, a large amount of labor and time may be required, thus making it costly and/or impractical for use at typical chain speeds in a commercial slaughter facility.

Substantial differences exist between the method for tenderizing meat disclosed in this specification and that disclosed by Claus and Marriott in the Tendercut Process. In one embodiment of the invention, only the vertebra or vertebrae and not all minor muscles, connective tissue, and fat are separated, which contrasts with the Tendercut Process described by Claus and Marriott, where the major muscle (such as the longissimus dorsi) entirely supports the remainder of the carcass because the remaining muscles, connective tissue, adipose tissue, and fat are separated. In one embodiment, the act of separating one or more vertebrae is conducted without separation of a substantial portion of the connective tissue, fat, and minor muscles adjacent the vertebrae separation. The method of one embodiment of the invention therefore saves time and reduces costs, and hence it is more viable for commercial meat production processes. The method of the invention may also be significantly easier to perform because a large number of cuts, severs, and muscle separations are not necessary as for the Claus and Marriot Tendercut Process, which is an invasive process requiring many detailed cuts. The Tendercut Process, for instance, requires at least two steps—first, sawing the vertebrae with a saw, and second, cutting muscle, tissue, and fat with a knife in numerous locations. The increased simplicity of the method of the invention also decreases the chance of damage to major muscles of the carcass, which could result in decreased meat quality and hence lost value. Further, the method of the invention offers the benefits of moving and swinging of the carcass along an automated chain or line during commercial meat production, thus further aiding in stretching the muscle. The Tendercut Process disclosed by Claus and Marriot, on the other hand, discloses a hanging beef carcass in a laboratory setting, not in a commercial production process, and hence it is not subjected to swinging and moving of the carcass. In addition, the method of the invention differs from the Stouffer patent in that the method of the invention is suitable for use in today's commercial meat production facilities. Other advantages and benefits of the embodiments of the invention disclosed throughout this specification will be apparent to one skilled in the art.

In some embodiments of the present invention, a portion of the fat, minor muscles, and connective tissue surrounding the major muscle or muscles in the area of the vertebra or vertebrae separation may also be separated or affected during the separation process. In other embodiments, the fat, minor muscles, and connective tissue on the portion of the carcass opposite the vertebrae will not be separated or significantly affected. Because fat, minor muscles, and connective tissue surround the entire major muscle, separating such fat, minor muscles, and connective tissue would be a time consuming and therefore expensive procedure, and would be difficult to perform at commercial chain speeds. In addition, performing such separations increase the chance of damage to major muscles, which can be costly errors due to damaged meat products.

FIG. 1 shows a side view of a beef carcass 10. As illustrated, the skeletal structure includes cervical vertebrae 12, thoracic vertebrae 14, and lumbar vertebrae 16, and sacral vertebrae 18. FIG. 1 further shows the ribs 22.

Figure 2:
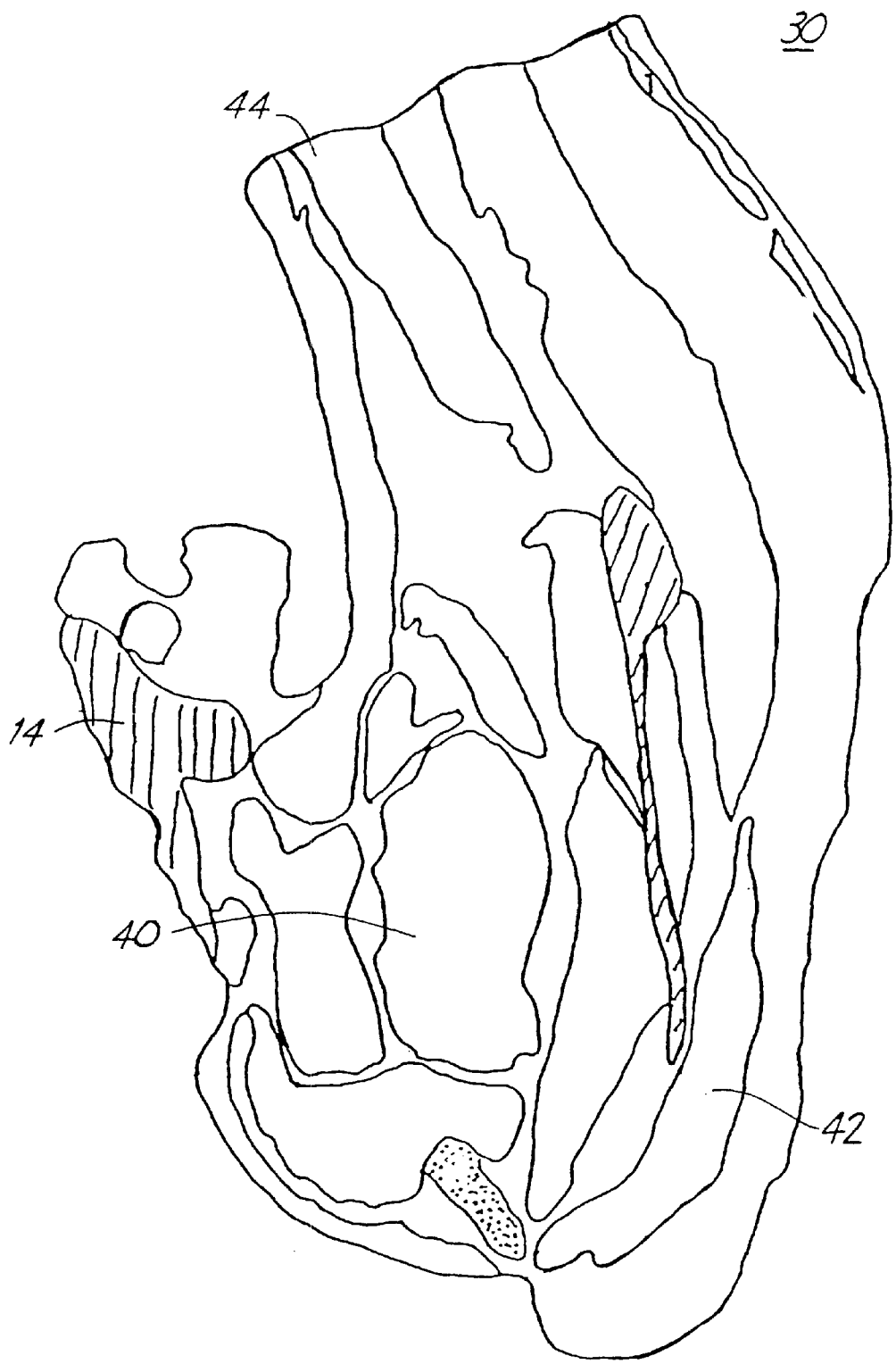
FIG. 2 is a top view of blade chuck steak as cut approximately along line A—A of FIG. 1.
Figure 3:
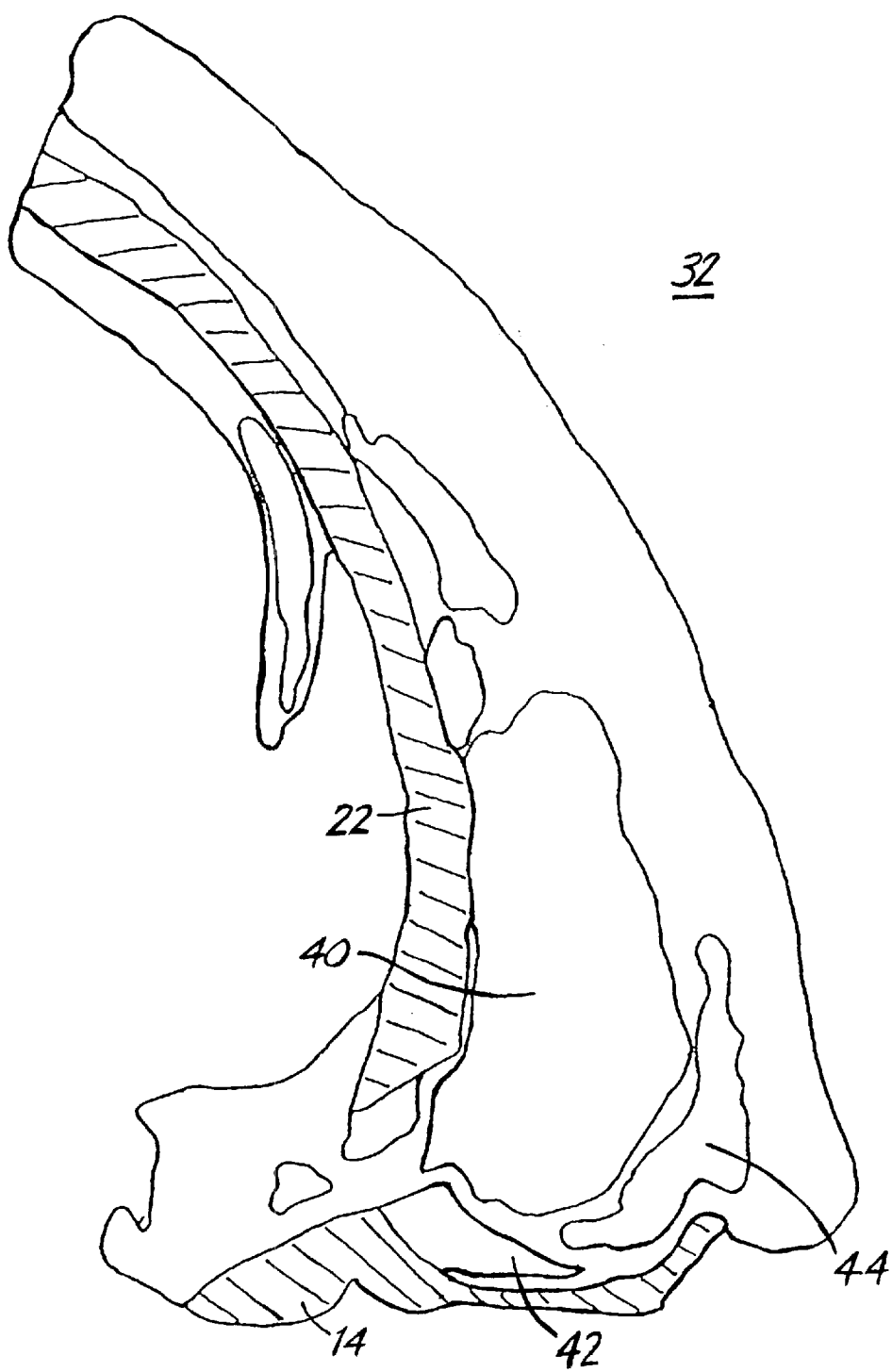
FIG. 3 is a top view of rib steak as cut approximately along line B—B of FIG. 1.
Figure 4:
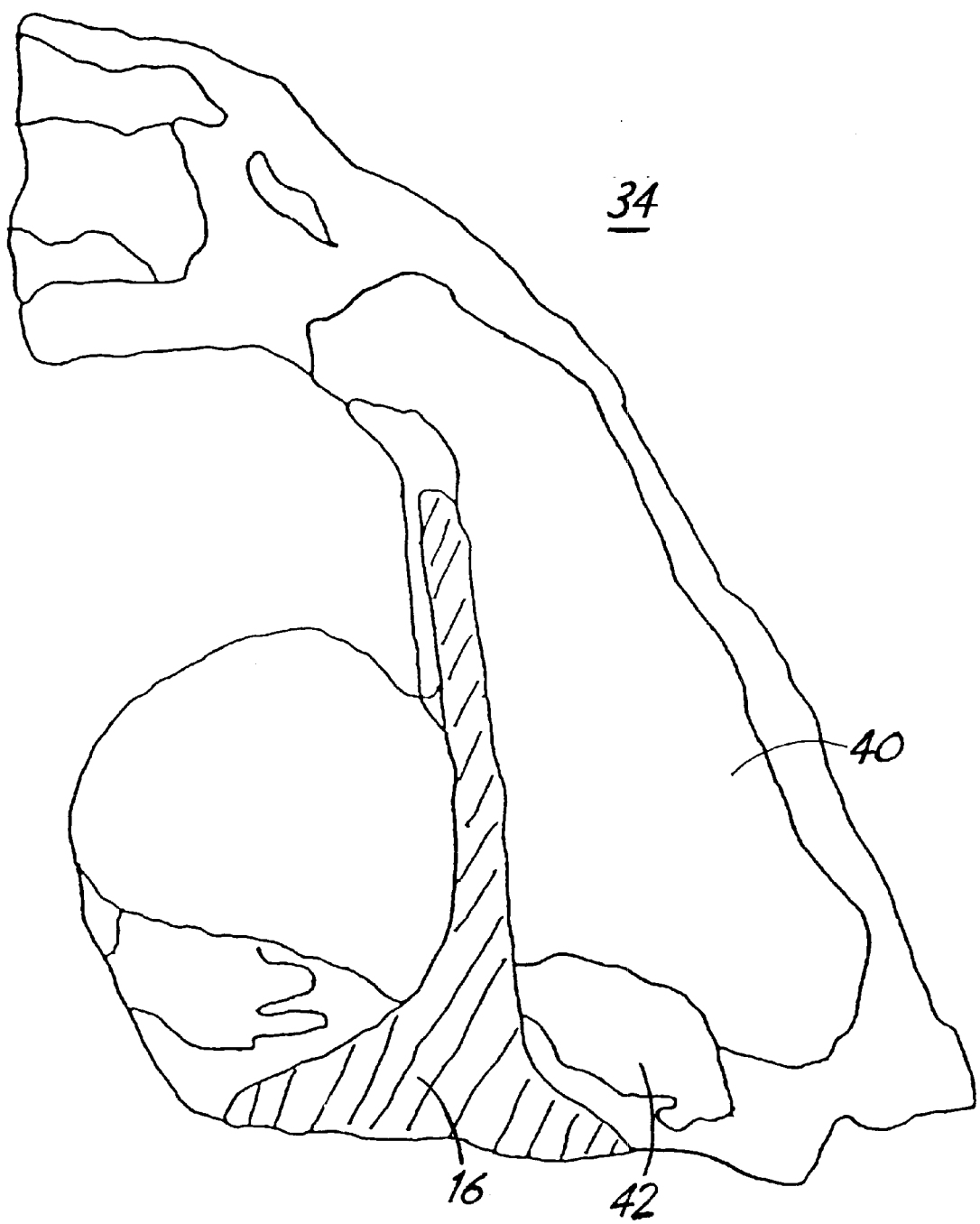
FIG. 4 is a top view of porterhouse steak as cut approximately along line C—C of FIG. 1.
Figure 5:
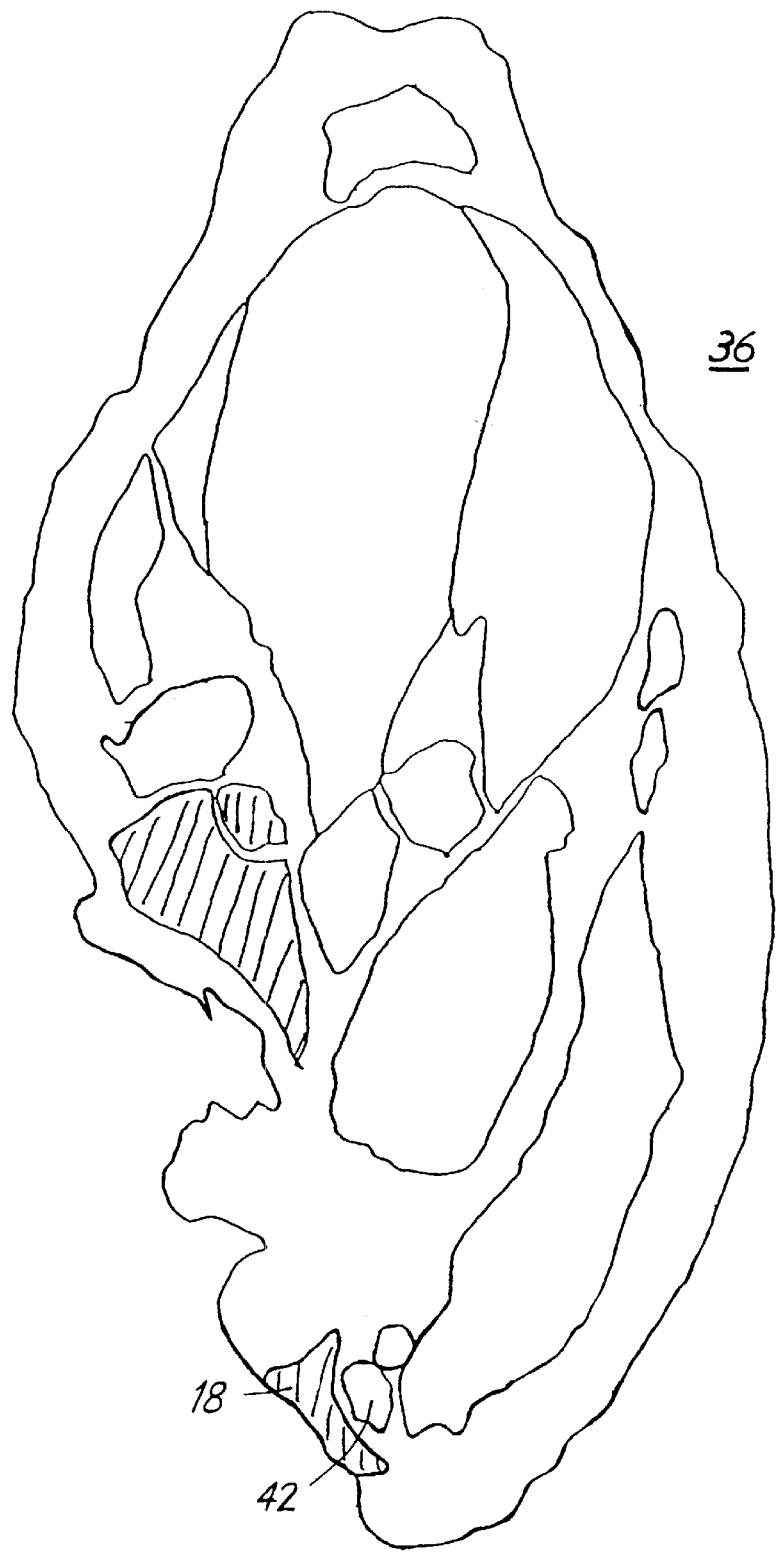
FIG. 5 is a top view of wedge bone sirloin steak as cut approximately along line D—D of FIG. 1.
Figure 6:
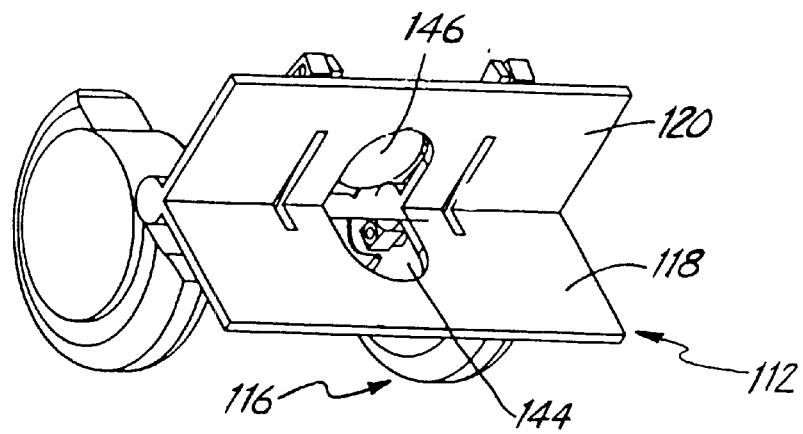
FIG. 6 is a perspective view of an apparatus of the invention.
Figure 7:
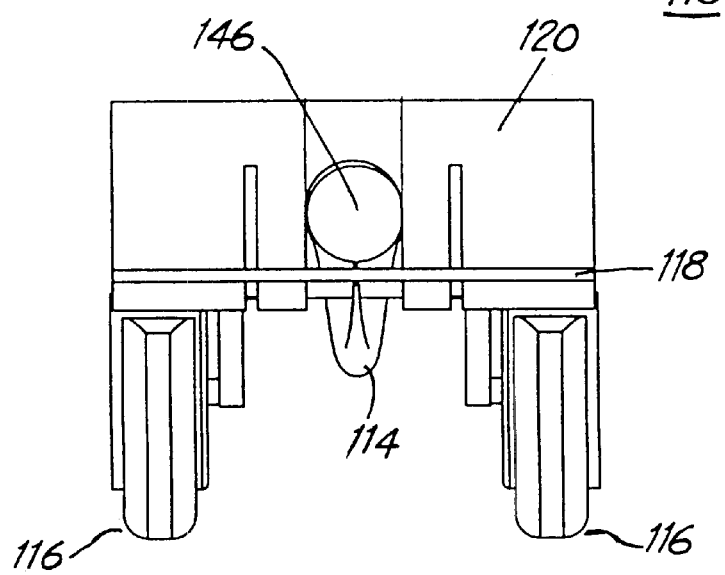
FIG. 7 is a front view of the apparatus of FIG. 6.
Figure 8:
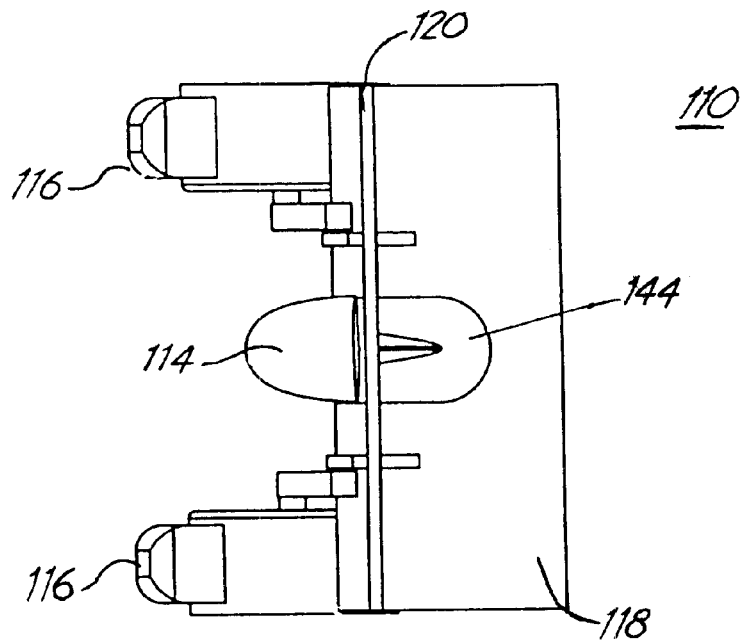
FIG. 8 is a top view of the apparatus of FIG. 6.
Figure 9:
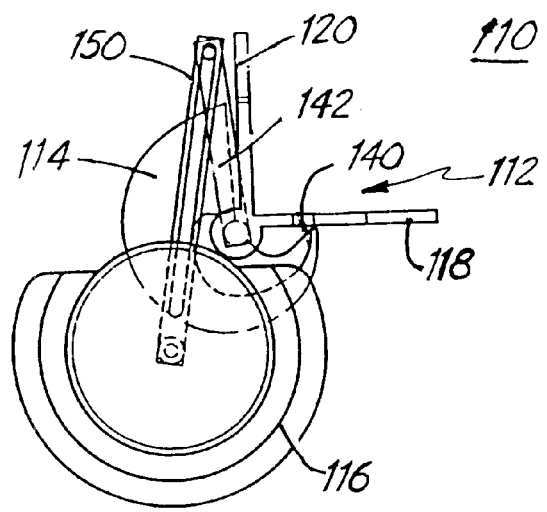
FIG. 9 is a side view of the apparatus of FIG. 6.

FIGS. 2–5 illustrate various cuts of meat corresponding approximately to cross section lines A—A, B—B, C—C, and D—D of FIG. 1. FIGS. 2–5 are cross-sectional views that illustrate the skeletal and muscular structure in various locations of a beef carcass. FIG. 2, for instance, illustrates a blade chuck steak 30, which results from a cut approximately along line A—A of FIG. 1. FIG. 3 illustrates a rib steak 32, which results from a cut approximately along line B—B of FIG. 1. FIG. 4 illustrates a porterhouse steak 34, which results from a cut approximately along line C—C of FIG. 1, and FIG. 5 illustrates a wedge bone sirloin steak 36, which results from a cut approximately along line D—D of FIG. 1.

Vertebral separations may be performed at any point along the vertebrae of the carcass. For instance, for a beef carcass, any one of the first, second, third, fourth, or fifth sacral vertebra 18 may be separated. Alternatively, a separation may be performed between any two sacral vertebrae 18 (for example, between the third and fourth sacral vertebrae), or posterior to one of the first or fifth sacral vertebra 18. A separation may also be performed on any one of the first, second, third, fourth, fifth, or sixth lumbar vertebra 16. Alternatively, a separation may be performed between any two lumbar vertebrae 16 (for example, between the fourth and fifth lumbar vertebrae 16), or posterior to one of the first or sixth lumbar vertebra 16. A separation may also be performed on any one of the first, second, third, fourth, fifth, sixth, seventh, eighth, ninth, tenth, eleventh, twelfth, or thirteenth thoracic vertebra 14. Alternatively, a separation may be performed between any two thoracic vertebrae 14 (for example, between the fifth and sixth thoracic vertebrae 14), or posterior to one of the first or thirteenth vertebra 14. It is to be understood, therefore, that a vertebra or vertebrae separation may be performed at any location on the spinal column.

To stretch a muscle and hence tenderize the meat resulting from that muscle, a vertebra or vertebrae separation may be performed. To stretch the longissimus dorsi muscle 40, which is shown in FIGS. 2–4, a vertebra or vertebrae separation is made along a portion of the lumbar vertebrae 16 or thoracic vertebrae 14 of the carcass. The longissimus dorsi muscle 40 is the major muscle in the area of such a separation, and also the muscle from which a significant portion of the high quality meat from a beef carcass results. In one embodiment, the vertebra or vertebrae separation may be made posterior to the thirteenth rib 22 of the carcass and anterior to the second lumbar vertebra 16, approximately in the area indicated by letter E in FIG. 1. This embodiment avoids damage to the area of the carcass (between the twelfth and thirteenth ribs) where beef carcasses are "ribbed" for USDA grading. In other embodiments, the vertebra or vertebrae separation may be made between the ninth and tenth ribs 22 of the carcass, approximately in the area indicated by line B—B in FIG. 1 (separation of the chine and featherbones). Another possibility is to separate the vertebra or vertebrae between the fifth and sixth ribs 22, which is approximately in the area indicated by letter F in FIG. 1.

In addition, more than one separation may be made, with each separation being made at a different location along any point of the vertebrae of the carcass. In one embodiment, in order to maximize the advantages of the invention, vertebra or vertebrae separations may be made at lower portions of the vertebrae before higher vertebrae separations. It should be noted that vertebral separations made at letters E or F, or line B—B, in FIG. 1 result primarily in a stretching of the longissimus dorsi muscle 40. Vertebral separations along certain points of the lumbar vertebrae 16 without further separation of minor muscles, tissue, and fat, result in separations or spaces of approximately one and a half inches, with such separations or spaces being measured from the face of the sever on one portion of the separated vertebra to the face on the other portion of the separated vertebra or the distance between two separated vertebrae.

In order to stretch the muscles in the round portion of the carcass, which may be seen in FIG. 5, a vertebral separation may be made along a portion of the sacral vertebrae 18.

Once again, a vertebral separation may be made along any portion of the sacral vertebrae 18, including in the portion indicated by line D—D in FIG. 1, in order to stretch the muscles in the round of the carcass.

In making the vertebral separations, in some embodiments of the invention, care is taken to avoid severing the major muscles in the area of the vertebral separation. For this reason, in one embodiment of the invention, only the vertebra or vertebrae—and not all minor muscles, fat, and connective tissue adjacent the major muscle—are separated. For example, as shown in FIG. 3, only a single thoracic vertebra 14 or two thoracic vertebrae 14 need be separated, and not the multifidus dorsi 42, spinalis dorsi 44, or other minor muscles in the portion of the carcass opposite the vertebrae. In addition, the fat and connective tissue surrounding the major muscle (the longissimus dorsi muscle 40 in FIG. 3) need not be separated, aside from the fat and connective tissue that is incidentally separated during separation of the vertebra or vertebrae. Although portions of the fat, connective tissue, and minor muscles may be severed or partially separated during the process of vertebral separation, no special effort need be made to separate these areas in one embodiment of the invention.

In some embodiments of the present invention, the vertebra or vertebrae separation includes the separation of the entire bone structure of the vertebra or vertebrae. In some embodiments, the present invention involves the splitting of a single vertebra into two or more pieces, or the splitting and/or increased spacing between two vertebrae. In any embodiment, the present invention involves disruption and/or dislocation of a normal vertebra or the normal relationship between vertebrae. For examples, a vertebra or vertebrae separation could include a complete separation and/or removal of the vertebral column, thoracic vertebra or vertebrae, and/or the spinal processes adjacent the vertebral column.

Another embodiment of the present invention is a red meat slaughter animal carcass, wherein a vertebra or the vertebrae of the carcass have been separated prior to rigor mortis to increase meat tenderness through muscle fiber elongation.

2. Stretching of the Muscle Fibers

The separation of the vertebra or vertebrae causes the weight of the portion of the carcass below the separation to pull on the muscle fibers adjacent to the separation, thus causing a stretching of muscle fibers in the carcass. Separation of the vertebra or vertebrae results in the extension of the length or tearing of the sarcomeres (muscle fiber complex) and therefore increases tenderness of the resulting meat.

Although the timing of the vertebra or vertebrae separation (measured in the amount of time after slaughter) may vary, the separation, in one embodiment, is made in order to maximize the muscle stretch. To optimize the muscle stretch and hence the resulting tenderness of the meat, vertebra or vertebrae separation is typically performed prior to completion of rigor mortis of the carcass (pre-rigor), which typically takes place within approximately 3–24 hours after slaughter. After rigor mortis, muscle fibers will be immobilized and hence vertebra or vertebrae separation will have a limited effect on meat tenderness.

During the commercial production of meat, vertebra or vertebrae separation in accordance with this specification may be made at any time prior to rigor mortis. In some typical commercial processes, carcasses are steam pasteurized approximately thirty to sixty minutes after slaughter and prior to being chilled. Electrical stimulation may be performed on the carcasses either before or after steam pasteurization, or both before and after pasteurization. Although vertebra or vertebrae separation may be performed at any time after slaughter and prior to rigor mortis in accordance with the invention, in one embodiment, vertebra or vertebrae separation may be performed after steam pasteurization and prior to chilling of the carcass. In such an embodiment, electrical stimulation may be performed on the carcass either before or after vertebra or vertebrae separation to further increase tenderness of the meat. In another embodiment, vertebral separation is performed first, followed by electrical stimulation and steam pasteurization.

In one embodiment of the present invention, vertebral separation is performed first, followed by electrical stimulation followed by steam pasteurization. An advantage of performing vertebral separation prior to electrical stimulation is that, in some instances, the prior separation enhances the beneficial effects of electrical stimulation. Namely, the muscles are induced to physically stretch more post-separation. In another embodiment, steam pasteurization is performed prior to vertebral separation and electrical stimulation.

Although the weight of the carcass and electrical stimulation may result in a muscle stretch after vertebral separation, other processes may also aid in stretching the muscle after separation. One such process is the moving or swinging of the carcass along a rail line or chain. Such movement may enhance the muscle stretch through jarring and motion, and such moving or swinging may be carried out during commercial production processes in which the carcass moves along at the operating chain speed. Further, in some embodiments, weights could be attached to the lower portion of the carcass in order to increase the muscle stretch, thus increasing the resulting meat tenderness. In other embodiments, however, no weights, aside from the carcass weight, are necessary in order to increase meat tenderness.

The vertebral separation method of the invention may be combined with other meat tenderization programs to increase meat tenderness. Breed and hump height programs for beef cattle, for instance, may be used with the vertebral separation method to increase meat tenderness. In addition, feed supplements or programs or chemical injections on live animals may also be used with the vertebral separation method of the invention. Aging of meat products may be used as well with the vertebral separation method of the invention.

The invention, as described above, offers numerous advantages over the previous tenderizing methods. First, no chemicals, enzymes, or other supplements are fed to the animal or injected into meat to increase tenderness, and the consuming public will therefore not be concerned about the effects of such chemicals, enzymes, or residues. Second, because no chemicals, enzymes, or supplements are used, there is no production cost for such materials. Third, the methods in these embodiments may be performed quickly and are relatively easy to perform, thus allowing the methods to be performed during commercial processes for the production of meat products at high chain speeds. Finally, because a minimal number of separations are performed and may be performed relatively easily, there is a decreased chance of damaging major muscles during meat production. Damage to major muscles significantly decreases the value of the carcass for commercial meat production.

Another advantage of the methods of the invention is that higher quality cuts of meat may result. The stretching or elongation of a muscle of a carcass results in an elongated muscle with a smaller diameter than the muscle would have without vertebral separation and stretching of the muscle. When the elongated muscle is cut or partitioned into a cut of meat, therefore, the cut of meat will need to be thicker in order to have the same weight as a cut of meat from a muscle that has not been elongated. For example, an eight ounce steak may be one and a half inches thick from a muscle that has not been elongated, and an eight ounce steak from the same area of an elongated muscle may be two inches thick (with a decreased diameter or circumference).

Cuts of meat that result from the method of the invention, therefore, may be thicker, while still having the same portion size (weight) as a cut of meat from a carcass that is not subjected to the method of the invention. A thicker cut of meat is generally more appealing to consumers, in part because of the visual qualities of such a cut of meat. In addition, the thicker cut of meat is generally better for cooking because a decreased amount of moisture will likely be evaporated or cooked out of the meat cut during cooking. Thicker meat cuts can typically withstand harsher cooking conditions, while maintaining tenderness and juiciness. The combined benefits of this aspect of the invention, therefore, may allow for higher priced meat cuts that are of the same weight as meat cuts from carcasses that are not subjected to the invention, which may be important for commercial meat production.

B. Experimental Examples

The applicants discovered the effect of vertebral separation on meat tenderness accidentally during tests to determine the effect of electrical stimulation on meat tenderness. In the electrical stimulation tests, sixty-seven whole carcasses were tested, with sixty-seven sides used as a control group, thirty-two sides being subjected to fifty volts for thirty seconds, and thirty-five sides being subjected to fifty volts for sixty seconds. During the course of the electrical stimulation tests, the incidence and severity of carcasses with broken vertebra or vertebrae was noted. The broken vertebra or vertebrae most likely resulted from hide removal, although the vertebrae or vertebra may have been broken by other means. In reviewing the results of the electrical stimulation tests, the applicants determined that carcasses with broken vertebra or vertebrae produced more tender meat, and hence further testing was done in a controlled setting to determine the effect of vertebral separation on meat tenderness.

In the set of experiments conducted, forty-four cattle were slaughtered (fifty were originally slaughtered, but six carcasses were removed from the study for various reasons). Forty-four carcass sides of the cattle were used for a control sample. For each of twenty-two carcass sides, the vertebra or vertebrae were separated in two places, with one separation posterior to the thirteenth rib and a second separation between the fifth and sixth ribs. For each of an additional twenty-two carcass sides, the vertebra or vertebrae were separated in three places, with one separation posterior to the thirteenth rib, a second separation between the fifth and sixth ribs, and a third separation between the ninth and tenth ribs. The separations were performed before rigor mortis and before chilling, approximately forty-five minutes postmortem. Performing separations at this time allowed for additional carcass swinging as the carcasses moved along a chain.

After chilling, the lip-on ribeye was removed from each of the eighty-eight sides and the strip loin was removed from twenty-seven of the sides in the study. The lip-on ribeyes were aged for fourteen days at one degree Celsius and then frozen at negative twenty degrees Celsius. Steaks were removed from the lip-on ribeyes at the location of the eleventh, ninth and seventh ribs, and the steaks were vacuum packed and stored at negative twenty degrees Celsius. Steaks were thawed for twenty-four hours and were then cooked. In this study, the steaks were broiled to a medium degree of doneness (seventy-one degrees Celsius). After the cooked steaks were chilled at four degrees Celsius for twenty-four hours, four cores of half-inch diameter were removed parallel to the muscle fiber for Warner-Bratzler shear force determination (a test commonly employed for defining the tenderness of a cut of meat). The peak forces from each of the four cores were averaged to represent the shear force of each steak.

Significant increases in tenderness (reduction in shear force readings) resulted for the carcasses for which the vertebra or vertebrae were separated. On average, the ribeye steaks from sides in which the vertebra or vertebrae were separated in two places resulted in an 11.5% reduction in shear forces compared to control sides. On average, the ribeye steaks from sides in which the vertebra or vertebrae were separated in three places resulted in an 11.2% reduction in shear forces compared to control sides. In addition, increased consistency of meat tenderness resulted. Although tests were not performed on all areas of the vertebra or vertebrae, it is believed that increased tenderness results from separation in other areas of the vertebrae that were not tested. Further, a single vertebra or vertebrae separation (at point E in FIG. 1; i.e., through the thirteenth or vertebrae 14) will also result in increased meat tenderness.

Further testing was conducted on additional cattle sides by making the following cuts shown in Table 1.

TABLE 1

| Experiment | Cuts |
| --- | --- |
| 0 | Separate 13th thoracic vertebra; saw feather bones |
| 1 | Separate 13th thoracic vertebra |
| 2 | Separate 13th thoracic vertebra; cut between feather bones |
| 3 | Separate 12th thoracic vertebra |
| 4 | Separate 12th thoracic vertebra; cut between feather bones |
| 5 | Separate 12th thoracic vertebra; separate 13th rib |
| 6 | Separate 12th thoracic vertebra; separate 13th rib; cut between feather bones |

In each case the chine extending from the referenced vertebrae was also cut or snipped. The feather bones refer to the bones extending toward the dorsal surface of the carcass. In experiments 5 and 6 the rib was separated because it attaches to the twelfth thoracic vertebrae and provides some amount of structural support. In each of these experiments, significant improvements in tenderness were noted.

The advantage of cutting through the twelfth thoracic vertebra (experiments 3–6) is that it avoids the potential for causing damage to the loin, if a "bone-in" loin is desired. As noted, however, the disadvantage is the need for an additional cut through the thirteenth rib to accomplish complete separation.

C. Apparatus for Separating Vertebra or Vertebrae

Figure 10:
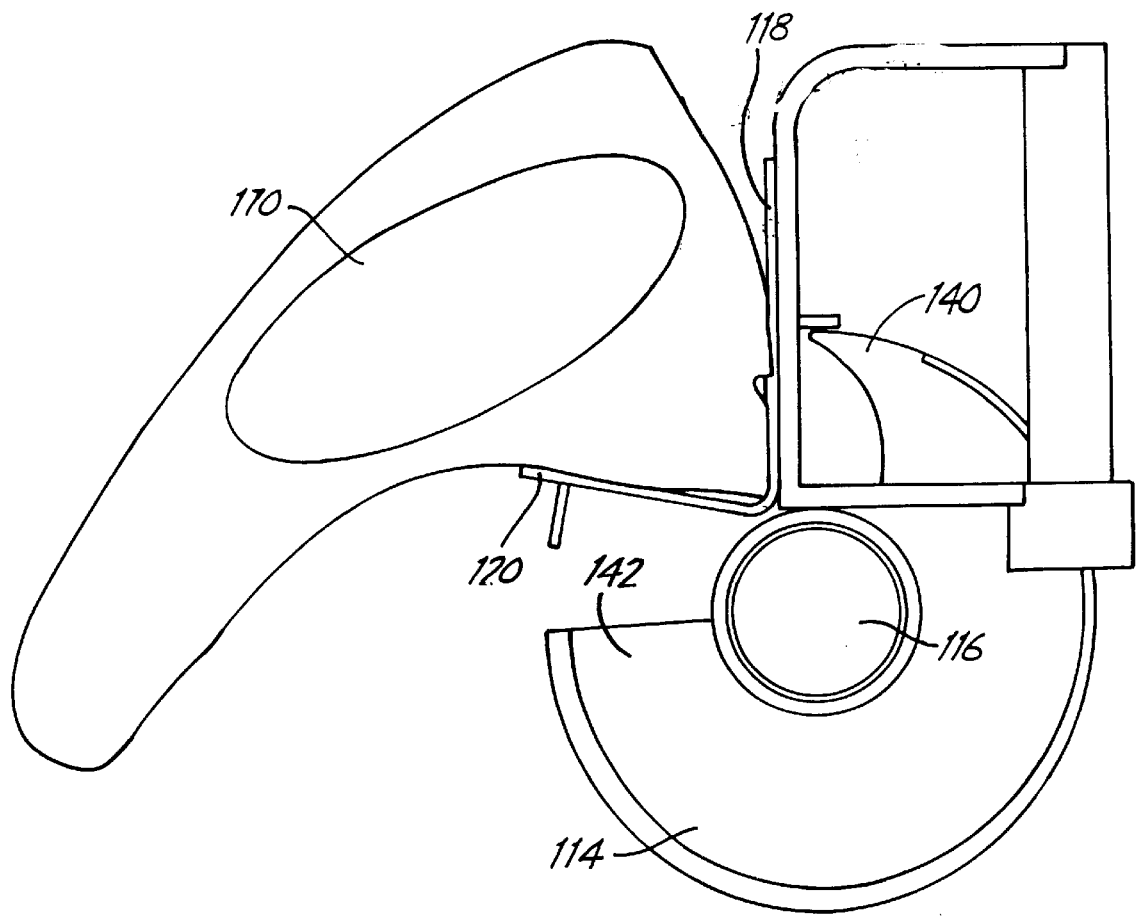
FIG. 10 is a view of the apparatus of FIG. 13 in operation prior to entry of the wedge into a beef carcass.
Figure 11:
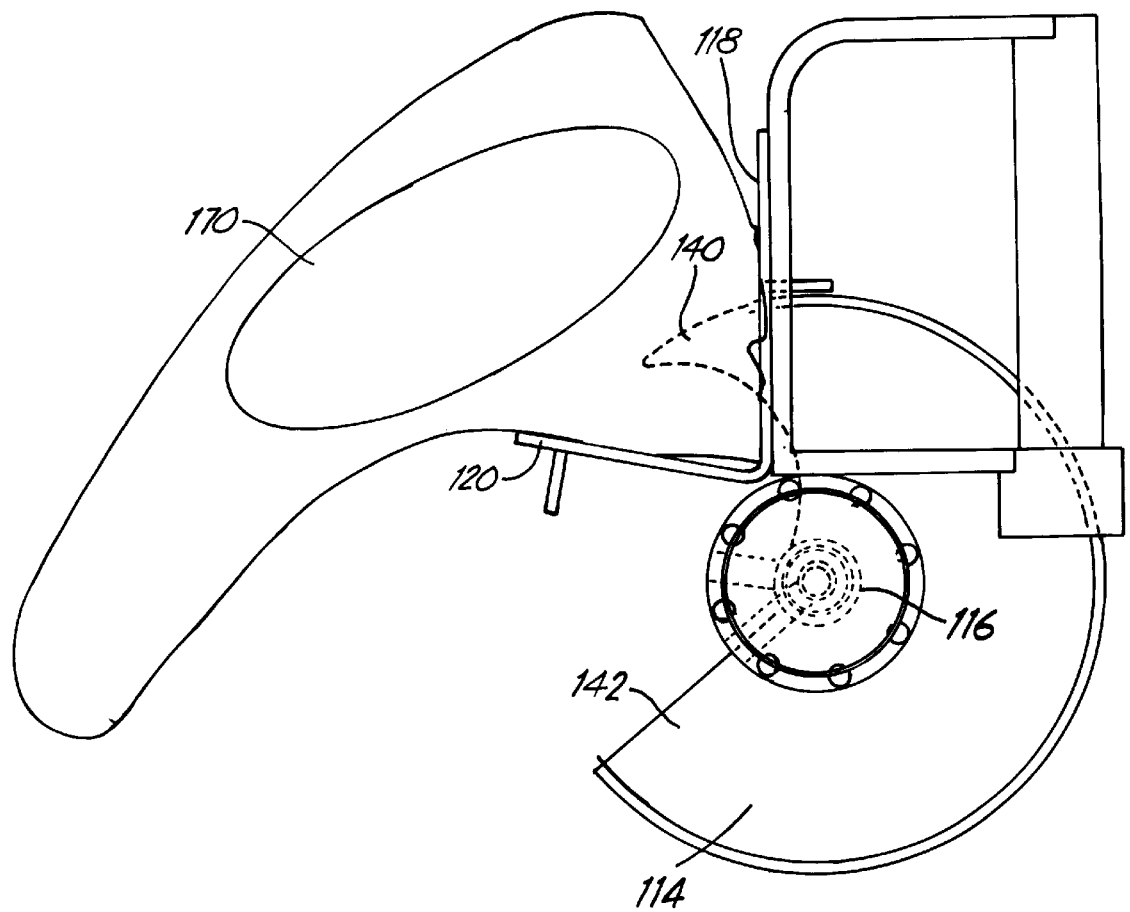
FIG. 11 is a view of the apparatus of FIG. 13 in operation with the wedge partially entered into a beef carcass.
Figure 12:
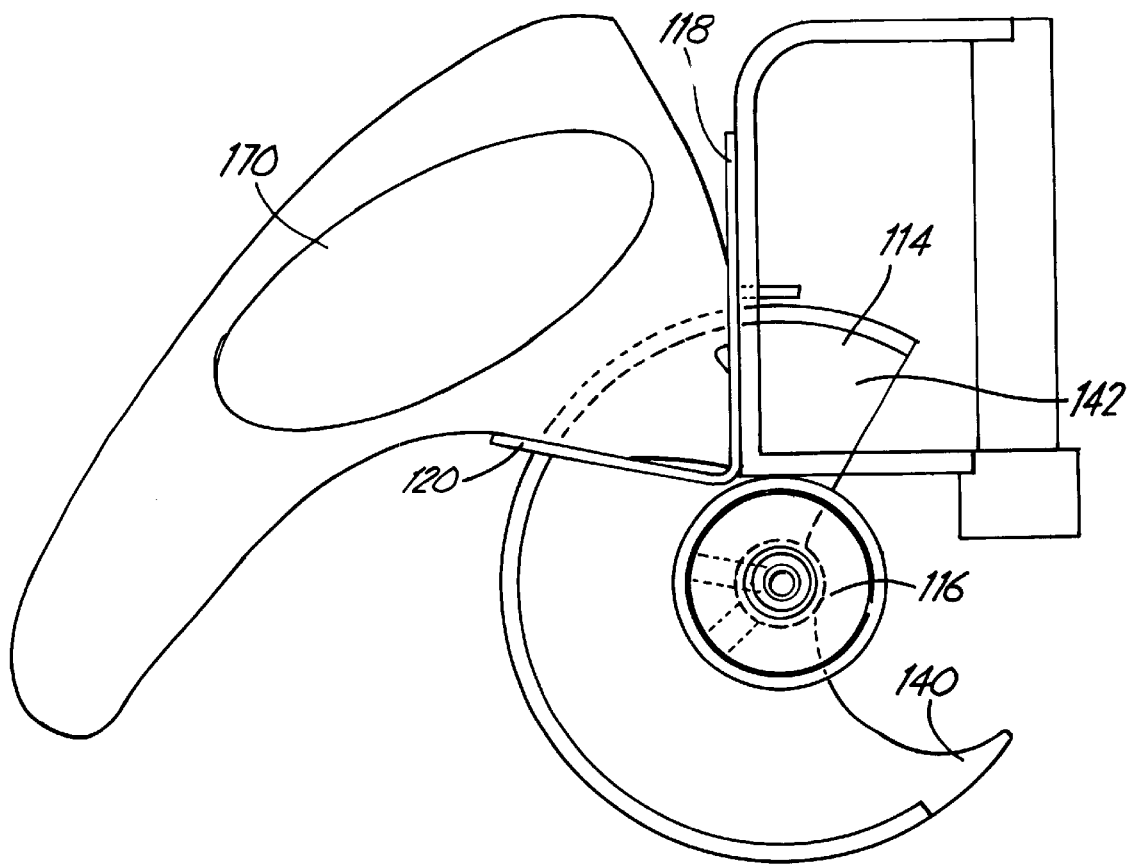
FIG. 12 is a view of the apparatus of FIG. 13 in operation with the wedge fully into a beef carcass.
Figure 13:
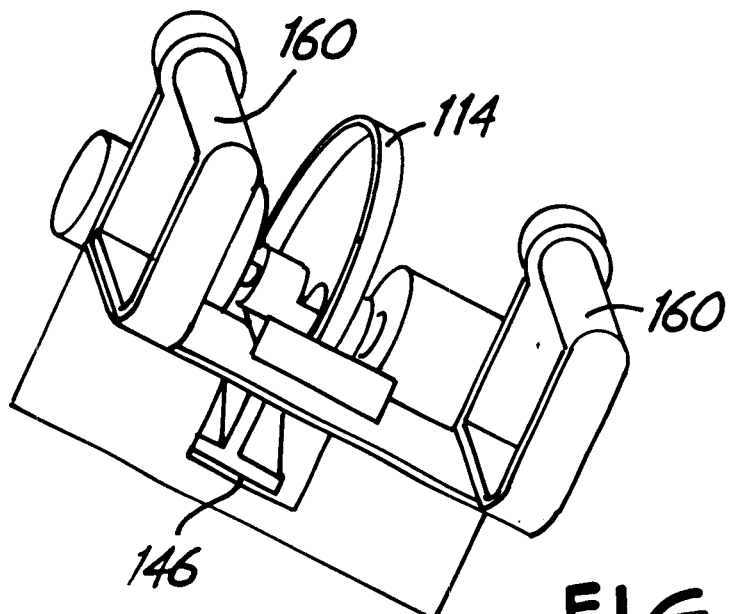
FIG. 13 is a perspective view of a second apparatus of the invention.
Figure 14:
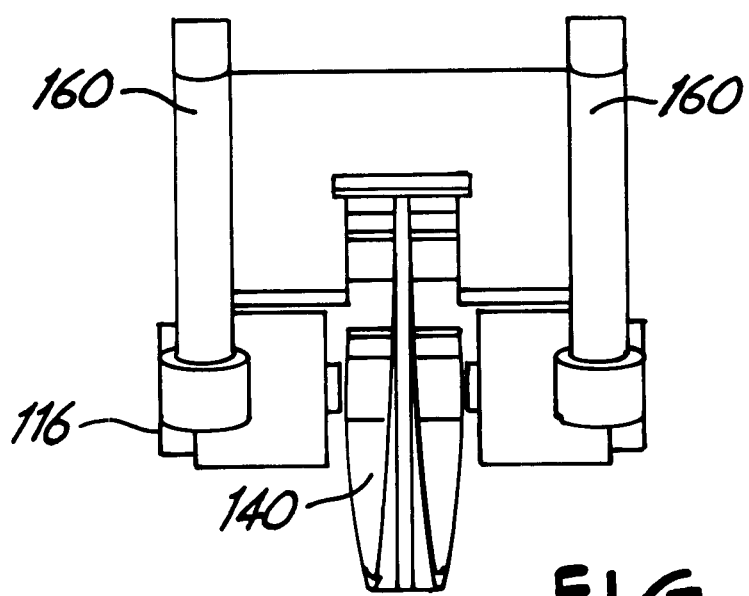
FIG. 14 is a front view of a the apparatus of FIG. 13.
Figure 15:
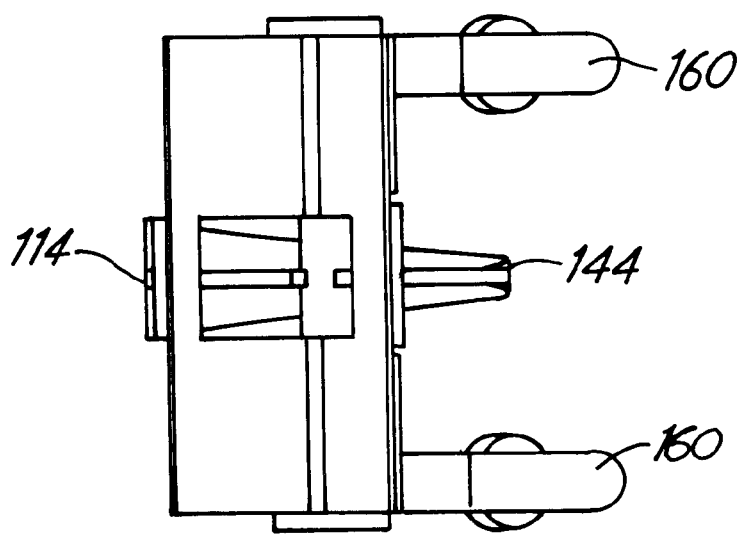
FIG. 15 is a top view of the apparatus of FIG. 13.
Figure 16:
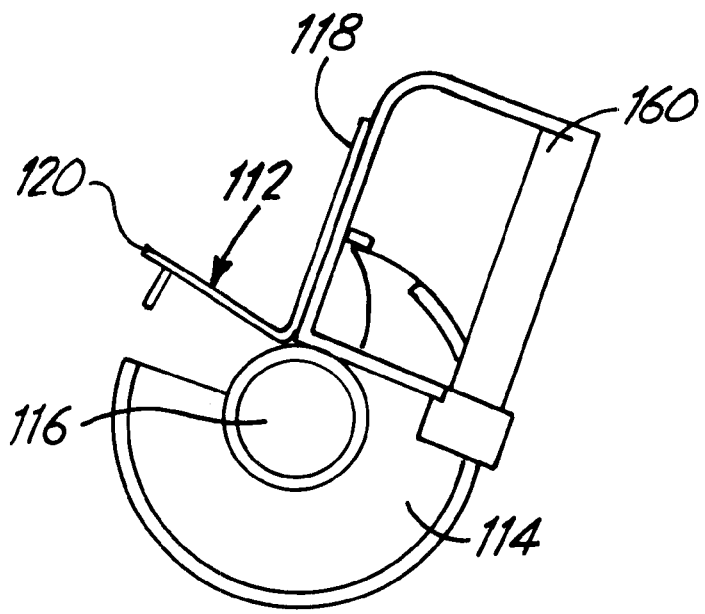
FIG. 16 is a side view of the apparatus of FIG. 13.

Embodiments of the method of the present invention may be carried out using suitable apparatus or appropriate devices. FIGS. 6–9 illustrate one exemplary apparatus for separating a vertebra or the vertebrae of a carcass, and FIGS. 10–12 illustrate such an apparatus during its use or operation. In one embodiment, the apparatus 110 for use in meat processing comprises a plate 112 for contacting a carcass, an operating member 114 operably coupled to the plate 112 and a drive mechanism 116 operably coupled to the operating member 114 for driving the operating member 114 into a carcass to manipulate or separate one or more vertebrae. Thus, in one embodiment, the apparatus 110 comprises a plate system 112, a piercing operating member 114, and a drive system 116. During operation, as shown in FIGS. 10–12, the plate system 112 may contact, be attached to or supported against the carcass of an animal, and then the piercing member 114 may be driven through a single vertebra or between two vertebrae to move, split and/or achieve separation of the vertebra or vertebrae. The components of the apparatus or device 110 may be assembled and operably coupled to each other using suitable devices known to those skilled in the art, including screws, rivets, bearings, and the like, and operating or driven components may be coupled using appropriate power or motive force providing and transmitting elements and linkages. Power source and/or drive elements may be electrical, pneumatic, hydraulic or manual.

In one embodiment, as shown in FIGS. 6–9, the plate system 112 includes a lower face plate 118 and an upper face place 120. In the depicted embodiment, the lower face plate 118 and the upper face plate 120 intersect at substantially a ninety degree angle, although this angle may vary in other embodiments of the invention, and the plate system 112 may take the form of a single, generally flat or curved plate adapted to receive or conform to a particular portion of a carcass. In some instances, it may take the form of a table—like working surface for receiving a carcass or a portion thereof. Also, although the plates 118 and 120 are depicted as fixed relative to each other, they may be respectively movably coupled by suitable adjustable brackets, slides or the like, whereby they may be relatively positioned at a selected angle.

As may be seen in FIGS. 10–12, which illustrate a second embodiment of the apparatus, during operation the plate system 112 may be placed against a carcass (a side of beef in FIGS. 10–12) with the lower face plate 118 along the portion of the carcass that was sawed when a whole carcass was split into two sides and the upper face plate 120 along the rib portion of the carcass. Each face plate 118, 120 may vary in size and geometry. In the embodiment depicted in FIGS. 6–9, each face plate 118, 120 is substantially rectangular in shape, and the lower face plate 118 is approximately 4.35 inches wide and ten inches long, while the upper face plate 120 is approximately 3.5 inches wide and ten inches long. Each face plate 118, 120 is about 0.25 inches thick in this embodiment. The plate system 112 may be made from any rigid material appropriate for food processing applications, including but not limited to metals and plastics. The plate system 112 may include a pin, a plurality of pins or posts, an elevated or relieved region or regions, or other positioning, guiding and attachment device or adaptations (not shown in FIGS.) that may be used to securely position or attach the apparatus 10 to the carcass during operation. A pin, or pins, for instance, could extend beyond each face plate 118, 120 and securely position and/or fasten or hold the carcass to the plate system 112.

The piercing member 114 may come in a variety of geometries. In one embodiment, the member 114 is wedge-like (thus, it may also be referred to as a piercing wedge 114 or an operating member 114), and although the cross section of the wedge shaped piercing member 114 may be circular in one embodiment, in other embodiments it may have differing cross sections, such as a square shape. The piercing wedge 114 depicted in FIGS. 6–9 is a rotational piercing wedge. In the embodiment in FIGS. 6–9, a first end 140 of the piercing wedge 114 reaches a sharp point, and a second end 142 of the piercing wedge 114 has a diameter of approximately 1.5 inches. The depicted piercing wedge 114 increases in diameter and curves with length along the piercing wedge 114 from the first end 140 to the second end 142.

In an embodiment of the present invention including a rotational piercing wedge 114, a rotational actuator may be used as the drive system or drive mechanism 116. In the embodiment depicted in FIGS. 6–9, two pneumatic rotational actuators of any type commonly used by those of skill in the art are operably coupled to the piercing member 114 to move the member 114. The piercing member 114 may rotate upon an axle or axis of rotation. In the embodiment of FIGS. 6–9, a link system 150 of two arms, with one arm being connected to the piercing wedge 114 and the second arm being attached to the rotational actuator or axle of rotation, may be used to translate the motion of the rotational actuator to the piercing member 114.

For an embodiment using a generally wedge-shaped rotational piercing member 114, each face plate 118, 120 may have a hole of sufficient size to allow the second end 142, or wide end, of the piercing member 114 to fit through and past the plate 112 to a desired extent or travel. These holes or apertures are designated by numerals 144 and 146 in FIGS. 6–9. The apertures 144, 146 need not be circular or any particular shape, but should be of sufficient size and shape to allow the thick second end 142 of the piercing member 114 to fit there through.

The apparatus may include one or more handles (not shown in FIGS. 6–9, but indicated at numeral 160 in FIGS. 13–16 of a second embodiment) for grasping, moving and handling the apparatus 110, and/or for positioning and supporting it relative to and/or against a carcass. An operator of the apparatus may therefore grasp the handles and support the apparatus against a carcass or, in another embodiment, the apparatus may be mounted or suspended on a stand, lift or support generally similar to those used to support other tools (saws, etc.) that may be positioned adjacent a carcass in meat processing operations. For actuation, the handles or any other portion of the apparatus may contain a triggering device (not shown in FIGS.) that actuates the drive mechanism to move the piercing member 114.

FIGS. 13–16 illustrate a second embodiment of the apparatus 110 of the present invention. In the embodiment of FIGS. 13–16, the apparatus includes handles 160, and the actuator 116 of the apparatus is directly attached to the piercing member 114 to drive or move it, and therefore the apparatus does not contain links or arms between the piercing member 114 and the actuator 116. The apparatus of FIGS. 13–16 also has an angle of slightly less than ninety degrees between the upper face plate 120 and the lower face plate 118, which may allow the apparatus to conform to certain carcasses and/or to separations or manipulations to be carried out on a carcass.

As can be seen in the three different views of FIGS. 10–12, which show operation of the apparatus embodiment shown in FIGS. 13–16, upon actuation by the drive system 116, the rotational wedge-like piercing member 114 moves into the carcass 170, separating two vertebrae of the carcass 170 or, in another application, separating a single vertebra. The piercing member 114 may be sized such that it causes a complete separation of the vertebra or vertebrae, but does not extend into the major muscle (the longissimus dorsi muscle in FIGS. 10–12), which could damage the major muscle. Instead, the piercing member 114 separates only the vertebra or vertebrae and the tissue, fat, and minor muscles immediately adjacent the vertebrae and the area in which the piercing member 114 is used. In an embodiment in which the second end 142 of the piercing member 114 is approximately 1.5 inches in diameter, a separation of 1.5 inches results upon use of an apparatus of the invention using such a piercing member 114. During operation, the piercing member 114 may enter the carcass 170 at any point that results in a clean separation of the vertebra or vertebrae. FIGS. 10–12 illustrate the piercing member 114 entering the vertebra or vertebrae on the surface exposed by the cutting to split the carcass into two sides during commercial meat production.

In another embodiment of the invention (not shown in the figures), a linear piercing member 114 may be used in conjunction with a linear actuator as the drive system 116. In such an embodiment, the linear piercing member 114 may be a rod that is sharpened at one end or, alternatively, a linear rod that tapers from a larger thickness or diameter to a decreased thickness or diameter or sharp point at the other end. One or more linear actuators may be used to drive the linear piercing member 114 into the vertebra or between two vertebrae. Much like other embodiments of the piercing member 114, an embodiment using a linear piercing member 114 may be sized and oriented such that use of the piercing member 114 does not result in damage to the major muscle near the vertebrae, but instead results only in separation of the vertebra or vertebrae and possibly minor muscles, connective tissue, and fat immediately adjacent the vertebra or vertebrae and area in which the piercing member 114 enters the carcass. It should understood that any embodiment of the present invention may be adapted for selecting the depth of penetration of the member 114; this may be accomplished by providing apertures 144, 146 of a particular, selected size as exemplified in the figures. It also may be accomplished by providing suitable stops or shoulders on the member 114 or on the drive mechanism 116 coupled thereto as is known in the motive and/or mechanical arts. While powered or driven embodiments of the apparatus 110 are depicted, it should be appreciated that manual embodiments are possible, including manual embodiments with suitable gearing or force multiplying features.

Use of an apparatus for manipulating, separating or piercing such as that disclosed above may result in repeatably accurate vertebral separations that require a minimal amount of effort. Through the use of such an apparatus 110, a vertebra or vertebrae may be separated quickly at chain speeds that match those commonly used during commercial meat production processes. Such an apparatus 110 performs an act of piercing that may be quickly and repeatably performed on carcass after carcass without damaging major muscles. Unlike the use of a saw to sever the vertebrae of the carcass, the use of an apparatus 110 such as that disclosed above can repeatably manipulate and/or separate a single vertebra or two vertebrae without risking damage to major muscles, because the piercing member 114 will repeatably reach the same depth into the carcass without harming the major muscles. In one embodiment of the present invention, an air-powered or hydraulic-powered circular saw, for example one sold under the "Jarvis" brand name, is used to separate the vertebrae.

While the present invention has been described with reference to several embodiments thereof, those skilled in the art may recognize various changes that may be made without departing from the spirit and scope of the claimed invention. Accordingly, this invention is not limited to what is shown in the drawings and described in the specification but only as indicated in the appended claims. Any numbering or ordering of the elements in the following claims is merely for convenience and is not intended to suggest that the ordering of the elements of the claims has any particular significance other than that otherwise expressed by the language of the claims.

Although the present invention has been described with reference to preferred embodiments, workers skilled in the art will recognize that changes may be made in form and detail without departing from the spirit and scope of the invention. Any references to front and back, right and left, top and bottom, upper and lower, and horizontal and vertical are intended for convenience of description, not to limit the present invention or its components to any one positional or spatial orientation. All dimensions of the components in the attached figures may vary with a potential design and the intended use of an embodiment of the invention without departing from the scope of the invention.

We claim:

1. A method for tenderizing meat in a red meat slaughter animal, the method comprising:

separating at least one vertebra of a carcass of a red meat slaughter animal prior to rigor mortis to enable stretching of muscle fibers in the carcass;

wherein the act of separating is conducted at a commercial chain speed;

further wherein the act of separating is conducted without separating connective tissue, fat, or minor muscles on a portion of the carcass opposite the vertebra.

2. The method of claim 1 wherein the act of separating includes separating a twelfth thoracic vertebra.

3. The method of claim 1 wherein the act of separating is conducted without separating the multifidus dorsi muscle or the intercostal muscles of the carcass.

4. The method of claim 1 further comprising moving the carcass on a processing chain line at a chain speed of at least 150 head per hour.

5. The method of tendering meat in a red meat slaughter animal, the method comprising:

separating at least one vertebra of a carcass of a red meat slaughter animal prior to rigor mortis to enable stretching of muscle fibers in the carcass;

wherein the act of separating is conducted at a commercial chain speed;

further wherein the act of separating is conducted without separating the multifidus dorsi muscle and the intercostal muscles of the carcass.

6. The method of claim 5 wherein the act of separating includes separating a twelfth thoracic vertebra.

7. The method of claim 5 further comprising moving the carcass on a processing chain line at a chain speed of at least 150 head per hour.

8. The method of claim 5 wherein the at least one vertebra is a ninth vertebra located between a ninth and a tenth rib of the carcass.

9. The method of claim 5 wherein the at least one vertebra is a fifth vertebra located between a fifth and a sixth rib of the carcass.

10. The method of claim 5 wherein the at least one vertebra includes a first vertebra located between a twelfth rib and a thirteenth rib, a second vertebra located between a ninth rib and a tenth rib, and a third vertebra located between a fifth rib and a sixth rib of the carcass.

11. The method for tenderizing meat in a red meat slaughter animal, the method comprising:

separating at least one vertebra of a carcass of a red meat slaughter animal prior to rigor mortis to enable stretching of muscle fibers in the carcass;

wherein the act of separating is conducted at a commercial chain speed;

further wherein the act of separating is conducted without the separation of a substantial portion of the connective tissue, fat, or minor muscles adjacent the vertebra.

12. The method of claim 11 wherein the act of separating the at least one vertebra includes separating a vertebral column and a spinal process.

13. The method of claim 11 further comprising moving the carcass on a processing chain line at a chain speed of at least 150 head per hour.

14. The method of claim 11 wherein the commercial chain speed is at least 350 head per hour.

15. The method of claim 14 wherein the commercial chain speed is at least 600 head per hour.

16. The method of claim 11 further comprising electrically stimulating the carcass after the act of separating the at least one vertebra.

17. The method of claim 11 wherein the act of separating is performed on a thirteenth thoracic vertebra of the carcass.

18. The method of claim 11 wherein the act of separating includes separating a twelfth thoracic vertebra and a thirteenth rib of the carcass.

19. The method of claim 11 wherein the act of separating is performed on one or more vertebrae posterior to a thirteenth rib and anterior to a second lumbar vertebra.

20. The method of claim 11 wherein the act of separating is conducted without separating the multifidus dorsi muscle or the intercostal muscles of the carcass.

21. A method for tenderizing meat in a red meat slaughter animal, the method comprising:

separating at least one vertebra of a carcass of a red meat slaughter animal prior to rigor mortis to enable stretching of muscle fibers in the carcass; and applying electrical stimulation to the carcass;

wherein the acts of separating and applying are conducted at a commercial chain speed; and further wherein the act of separating is conducted without separating the multifidus dorsi muscle and the intercostal muscles of the carcass.

* * * * *

UNITED STATES PATENT AND TRADEMARK OFFICE
CERTIFICATE OF CORRECTION

PATENT NO.   : 6,478,667 B2
DATED        : November 12, 2002
INVENTOR(S)  : Brian W. Bell, Howard G. Dolezal and Darren J. Grose It is certified that error appears in the above-identified patent and that said Letters Patent is hereby corrected as shown below:

<u>Column 12,</u>
Line 26, between "thirteenth and vertebrae" please insert -- thoracic -- therefor.

Signed and Sealed this

Twenty-fifth Day of March, 2003

JAMES E. ROGAN
*Director of the United States Patent and Trademark Office*